United States Patent [19]

Hendriks

[11] 4,211,993

[45] Jul. 8, 1980

[54] DEVICE FOR PROCESSING HIGH-FREQUENCY ELECTRICAL SIGNALS

[75] Inventor: Johannes H. Hendriks, Eindhoven, Netherlands

[73] Assignee: U.S. Philips Corporation, New York, N.Y.

[21] Appl. No.: 952,361

[22] Filed: Oct. 18, 1978

[30] Foreign Application Priority Data

Nov. 16, 1977 [NL] Netherlands .................. 7712604

[51] Int. Cl.² .......................................... H01F 21/06
[52] U.S. Cl. .................................... 336/131; 336/136
[58] Field of Search ................ 336/130, 131, 136, 65; 334/74, 75, 76

[56] References Cited

U.S. PATENT DOCUMENTS

| | | | |
|---|---|---|---|
| 1,898,792 | 2/1933 | Shermund | 336/131 X |
| 2,204,086 | 6/1940 | Kamenaroric | 336/136 X |
| 2,344,091 | 3/1944 | Kirk | 336/136 X |
| 2,995,719 | 8/1961 | Osborn et al. | 336/136 |
| 3,141,147 | 7/1964 | Delp | 336/131 |
| 3,631,368 | 12/1971 | Thompson | 336/131 |

FOREIGN PATENT DOCUMENTS

| | | | |
|---|---|---|---|
| 546864 | 8/1942 | United Kingdom | 336/136 |
| 628024 | 8/1949 | United Kingdom | 336/136 |

*Primary Examiner*—Thomas J. Kuzma
*Attorney, Agent, or Firm*—Thomas A. Briody; William J. Streeter; Edward W. Goodman

[57] ABSTRACT

A high-frequency device, comprising a number of solenoid coils which are arranged in a row along the edge of a board. Parallel to the row of coils there is provided a plate which extends perpendicularly to the board and which is provided with apertures which are coaxial with the coils. Adjusting cores for adjusting the coils are provided in the apertures.

1 Claim, 4 Drawing Figures

DEVICE FOR PROCESSING HIGH-FREQUENCY ELECTRICAL SIGNALS

BACKGROUND OF THE INVENTION

The invention relates to a device for processing high-frequency electrical signals, comprising a board accommodating electronic components, including a number of solenoid coils which can be adjusted by means of adjusting cores and which are arranged in a row parallel to an edge of the board, their axes extending perpendicularly to said edge.

"High frequency" is to be understood herein to mean frequencies above approximately 1 MHz. Devices for processing such signals may be, for example, selective amplifiers, oscillators, filters and notably combinations thereof such as tuning units for television receivers. Devices of this kind are adjusted after mounting by adjustment of the adjustable coils. French Pat. No. 1.152.337 describes such a device in which each coil is wound on a coil former which serves as a holder for an adjusting core. The construction of such coils is comparatively complex and hence expensive.

Variable coils of a simpler construction are known from U.S. Pat. No. 2,722,662. Therein, parts of coils are displaced relative to each other in order to vary the inductance. The use of such coils in devices of the described kind is comparatively inexpensive per se, but adjustment is time consuming, so that the price of the coils is higher than desirable for many applications.

SUMMARY OF THE INVENTION

The invention has for its object to provide a device of the described kind in which the construction of the variable coils is extemely simple, while the adjustment can be very readily effected, even mechanized adjustment being possible.

To this end, the device in accordance with the invention is characterized in that the coils are self-supporting, a plate of insulating material, extending perpendicularly to the board, being arranged parallel to the row of coils, said plate of insulating material comprising apertures which are substantially coaxial with the solenoid coils and in which the adjusting cores are provided, said plate being provided, at the area of at least one of the aperatures, with a coupling piece which is slid into the associated coil and which comprises a passage which is coaxial with the aperture.

The coupling piece serves to enable simple positioning of the apertures in the plate and the coils with respect to each other.

DESCRIPTION OF THE DRAWINGS

The invention will be described in detail hereinaftr with reference to the accompanying diagrammatic drawing.

DESCRIPTION OF THE PREFERRED EMBODIMENT

Figure 2:
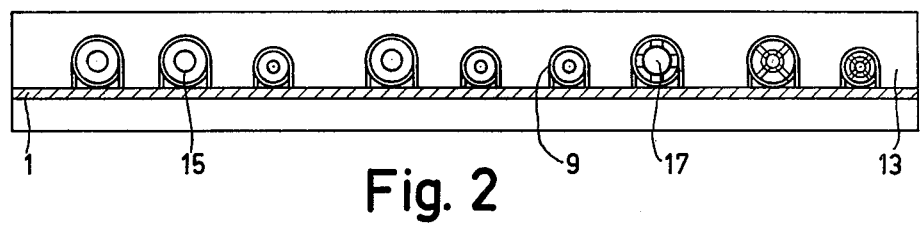
FIG. 2 is a sectional view taken along the line II—II.
Figure 1:
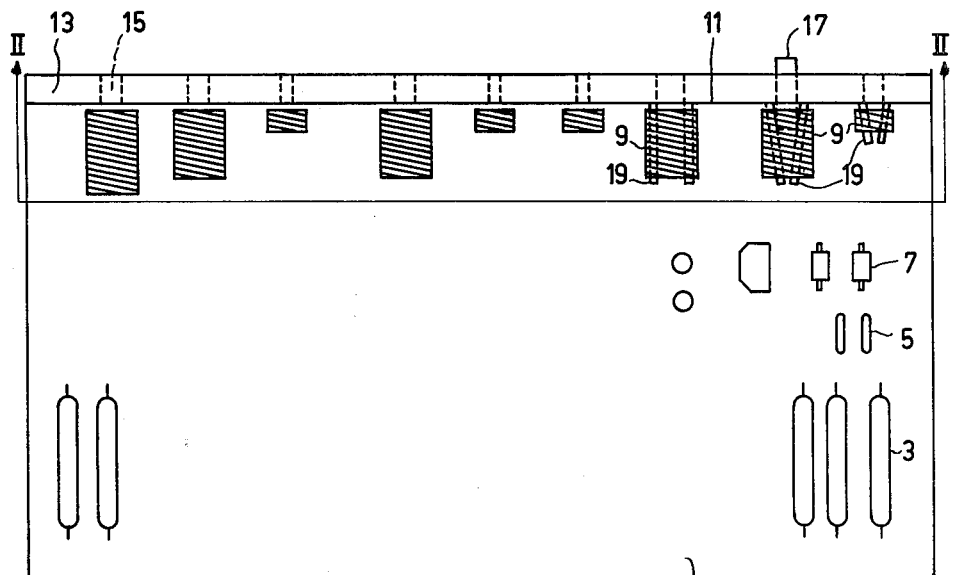
FIG. 1 is a plan view of an embodiment of a device in accordance with the invention.

The device shown in the FIGS. 1 and 2 comprises a printed wiring board 1 on which electronic components such as resistors 3, capacitors 5, semiconductor components 7 and adjustable coils 9 are mounted. Instead of a printed wiring board, use can also be made of a board with a thick or thin film circuit, part of the components then being accommodated on the board in the form of a film pattern.

The adjustable coils 9 are self-supporting (i.e. not wound on a coil former) solenoid coils. They are arranged in a row which is parallel to an edge 11 of the board 1, their axes extending perpendicularly to said edge. Parallel to the row of coils 9 there is provided a plate 13 of insulating material, preferably a synthetic material, which extends perpendicularly to the board 1. Therein are provided apertures 15, each of which is substantially coaxial with one of the solenoid coils 9. In the apertures 15 there are provided adjusting cores 17 for adjusting the coils 9. These adjusting cores 17 may be made of, for example, copper, iron, aluminium or ferromagnetic material. They are rod-shaped and have a diameter such that they can be slid into the apertures 15 with some friction. They may alternatively be provided with a thread, either self-cutting or cooperating with a thread provided in the apertures in advance.

Figure 3:
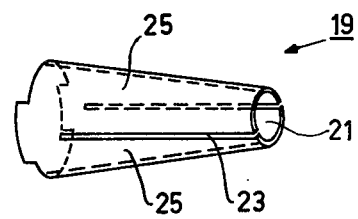
FIG. 3 is a perspective view, at an increased scale, of a coupling piece of the device shown in FIG. 1.

At the area of a number of apertures, the plate 13 is provided with a coupling piece 19 which is separately shown at an increased scale in FIG. 3. This coupling piece 19 initially is shaped as a truncated cone, so that it can be readily slid into the associated coil 9, thus being capable of correcting any small deviations of the position of the coil with respect to the aperture 15. It comprises a passage 21 which is coaxial with the aperture 15, and is furthermore provided with a number of cutouts 23 which extend in its longitudinal direction, so that its wall is divided into a number of resilient fingers 25. When an adjusting core 17 is introduced into the passage 21, these fingers 25 are spread so that they clear the passage for the adjusting core. Moreover, the fingers 25 are then pressed against the inner side of the coil 9, so that mechanical vibration of the coil 9 is substantially impossible. This offers the advantage that separate steps for mechanical damping of the coils 9 in order to prevent microphony are no longer required. FIG. 1 shows the spreading of the fingers 25 at the second coil from the right, the adjusting core 17 is situated at the beginning of the coupling piece 19, and at the third coil from the right the adjusting core has been slid into the coupling piece.

Figure 4:
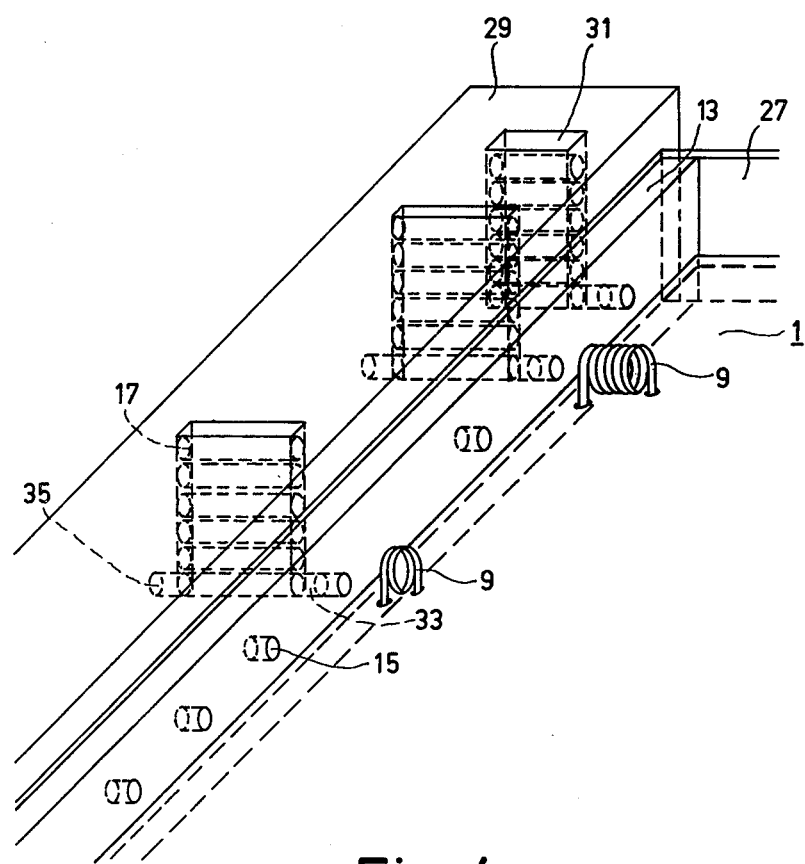
FIG. 4 is a perspective view of a part of the device in accordance with the invention during adjustment.

FIG. 4 diagrammatically shows how the coils 9 in the device in accordance with the invention, can be adjusted in a mechanized manner. The board 1 (on which only two coils 9 are shown for the sake of clarity) is accommodated, together with the plate 13, in a metal housing 27 of a customary type for high-frequency devices. This housing 27 comprises apertures (not shown) which are coaxial with the apertures 15 in the plate 13. Outside the housing 27, at the level of the plate 13, there is arranged a holder 29 which comprises a number of magazines 31 in which the adjusting cores 17 are situated. The lower adjusting core 17 is situated in front of an exit 33 which is coaxial with an aperture 15 and can be slid or screwed into the aperture 15 and further into the coil 9 by means of a tool (not shown), for example, a pin or a screwdriver, which is introduced via an entrance 35. For the sake of clarity, the coupling pieces have been omitted in FIG. 4.

During adjustment, the device is arranged in a test arrangement. By means of the tools, an adjusting core 17 is introduced into each coil 9 until the inductance of this coil reaches the correct value. As soon as the complete device has thus been adjusted, the device is removed and the tools are withdrawn, so that a next core is situated in front of the exit 33.

What is claimed is:

1. A device for processing high-frequency electrical signals, comprising a board accommodating electronic components including a plurality of solenoid coils, said solenoid coils being self-supporting and arranged in a row parallel to an edge of the board having the axes thereof extending perpendicularly to said edge, adjusting cores with which said solenoid coils may be adjusted, a plate (13) of insulating material, extending perpendicularly to the board (1) and being arranged parallel to the row of solenoid coils (9), said plate (13) comprising apertures (15) which are substantially coaxial with the solenoid coils and in which the adjusting cores (17) are provided, said plate (13) being provided, at the area of at least one of the apertures (15), with a coupling piece (19) which is slidable into the associated solenoid coil (9) and which comprises a passage (21) which is coaxial with the aperture (15) whereby when one of said adjusting cores is inserted into the passage of said coupling piece such that the associated solenoid coil may be adjusted, the coupling piece thereupon prevents mechanical vibration of the solenoid coil.

* * * * *